US012622053B2

(12) United States Patent
Xie et al.

(10) Patent No.: US 12,622,053 B2
(45) Date of Patent: May 5, 2026

(54) HYBRID CMOS WITH FIN AND NANOSHEET ARCHITECTURES

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Daniel Schmidt, Niskayuna, NY (US); Tsung-Sheng Kang, Ballston Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 555 days.

(21) Appl. No.: 18/089,634

(22) Filed: Dec. 28, 2022

(65) Prior Publication Data

US 2024/0222375 A1    Jul. 4, 2024

(51) Int. Cl.
*H10D 84/85*    (2025.01)
*H10D 30/67*    (2025.01)
(Continued)

(52) U.S. Cl.
CPC ....... *H10D 84/856* (2025.01); *H10D 30/6735* (2025.01); *H10D 30/6757* (2025.01); *H10D 62/121* (2025.01); *H10D 84/0167* (2025.01); *H10D 84/0188* (2025.01); *H10D 84/0193* (2025.01); *H10D 84/038* (2025.01); *H10D 84/853* (2025.01); *H10D 30/014* (2025.01);
(Continued)

(58) Field of Classification Search
CPC ........... H10D 84/0167; H10D 84/0193; H10D 84/853; H10D 84/856; H10D 30/014; H10D 30/024; H10D 30/6735; H10D 30/6757; H10D 30/43; H10D 62/121
See application file for complete search history.

(56) References Cited

U.S. PATENT DOCUMENTS 9,793,360 B2    10/2017    Arena
9,941,118 B2    4/2018    Leobandung
(Continued)

FOREIGN PATENT DOCUMENTS

CN          113675089 A     11/2021
WO      WO-2022258151 A1 * 12/2022    ......... H10D 84/0177

*Primary Examiner* — Tuan A Hoang
(74) *Attorney, Agent, or Firm* — Seed Intellectual Property Law Group LLP

(57) ABSTRACT
A hybrid semiconductor structure, a system, and a method of forming a hybrid semiconductor structure. The hybrid semiconductor structure may include a PFET region, where the PFET region includes a first channel in a fin shape; an NFET region, where the NFET region includes a second channel, the second channel including a nanosheet; and an isolation bar separating the PFET region from the NFET region. The system may include a hybrid semiconductor structure including a PFET region; an NFET region; an isolation bar separating the PFET and NFET region; and a gate surrounding a plurality of sidewalls of the first channel and the second channel. The method may include forming an isolation bar between a first channel material in an NFET region and a second channel material in a PFET region; forming the second channel material into a fin shape; and forming the first channel material into stacked nanosheets.

20 Claims, 17 Drawing Sheets

100

(51) Int. Cl.

| | | |
|---|---|---|
| *H10D 62/10* | (2025.01) | |
| *H10D 84/01* | (2025.01) | |
| *H10D 84/03* | (2025.01) | |
| *H10D 30/01* | (2025.01) | |
| *H10D 30/43* | (2025.01) | |
| *H10D 64/01* | (2025.01) | |

(52) U.S. Cl.

CPC ........... *H10D 30/024* (2025.01); *H10D 30/43* (2025.01); *H10D 64/017* (2025.01)

(56)                    References Cited

U.S. PATENT DOCUMENTS

| | | | |
|---|---|---|---|
| 10,332,803 B1 * | 6/2019 | Xie ...................... | H10D 84/853 |
| 10,867,867 B2 | 12/2020 | Chiang et al. | |
| 11,183,558 B2 | 11/2021 | Yeh et al. | |
| 11,335,776 B2 | 5/2022 | Wang et al. | |
| 11,417,653 B2 | 8/2022 | Yu et al. | |
| 2018/0033871 A1 * | 2/2018 | Xie ........................ | H10D 30/43 |
| 2019/0326286 A1 | 10/2019 | Xie et al. | |
| 2019/0355724 A1 * | 11/2019 | Chiang .............. | H10D 84/0167 |
| 2020/0044070 A1 * | 2/2020 | Wang ..................... | H10D 30/62 |
| 2021/0183852 A1 | 6/2021 | Li et al. | |
| 2021/0376076 A1 | 12/2021 | Su et al. | |

* cited by examiner

HYBRID CMOS WITH FIN AND NANOSHEET ARCHITECTURES

BACKGROUND

The present disclosure relates to semiconductors and transistors and, more specifically, to hybrid fin and nanosheet architectures within the semiconductor. Semiconductors, such as complementary metal-oxide-semiconductors (CMOS), are commonly used in computer chips and computer technology. These semiconductor chips/devices typically include transistor(s). Transistors are devices used to switch or amplify electric current or voltage.

Field-effect transistors (FETs) use an electric field effect to control current flow within a semiconductor. FETs have three terminals—a source, a drain, and a gate. The source may introduce/provide current to the transistor, the drain may be the terminal that provides the output current, and the gate may be used to control the current flow from the source to the drain. Specifically, FETs may use the electric charge of their gates to affect and control the current flow through the channel. Current may flow using charge carriers that may be either electrons or holes. Electron charge carriers may be negatively charged particles (i.e., electrons) that carry charge and create an electric current. Hole charge carriers (referred to herein as holes) are positions on the FET channel that lack an electron (for instance, at positions of positive charge that is equal to the negative charge of an electron and/or positions where an electron could or should be). These holes may be positive charges, and they may move in an opposite direction of electrons, in some instances. The electric charge and/or voltage of the FET gates may be used to control the movements of the electrons and/or holes, which may then affect the current and charge being transmitted through the channel from the source to the drain. One common type of FET is a finFET. FinFETs, as referred to herein, may be FETs in a vertical fin shape. FinFETs may have vertically stacked channels, and vertically stacked components in general, in order to form the tall, narrow fin shape of a finFET.

Another type of FET is a nanosheet transistor, also referred to herein as a nanosheet FET. Nanosheet transistors may include horizontally stacked nanosheets, instead of the thin vertical fin of an FET. Each nanosheet may act as a channel, therefore nanosheet transistors may include a plurality of channels for current to flow. Nanosheet transistors, like finFETs and other types of FETs, include a source, a drain, and a gate. In some instances, the gate in a nanosheet transistor may surround the channel portion (i.e., the stacked nanosheets) of the transistor, which allows the gate to surround all sides of the channel(s). This is different than a finFET, which has a gate that can surround up to three sides of the channel, but not the entire channel.

SUMMARY

The present invention provides a hybrid semiconductor, a system, and a method of forming a hybrid fin and nanosheet architecture within the semiconductor. The hybrid semiconductor structure may include a PFET region, where the PFET region includes a first channel in a fin shape. The hybrid semiconductor structure may also include an NFET region, where the NFET region includes a second channel, the second channel including a nanosheet. The hybrid semiconductor structure may also include an isolation bar separating the PFET region from the NFET region.

The system may include a hybrid semiconductor structure. The hybrid semiconductor structure may include a PFET region, where the PFET region includes a first channel in a fin shape. The hybrid semiconductor structure may also include an NFET region, where the NFET region includes a second channel, the second channel including a nanosheet. The hybrid semiconductor structure may also include an isolation bar separating the PFET region from the NFET region. The hybrid semiconductor structure may also include a gate surrounding a plurality of sidewalls of the first channel and the second channel.

The method may include forming an isolation bar between a first channel material in an NFET region and a second channel material in a PFET region. The method may also include forming the second channel material into a fin shape, resulting in a fin shaped channel in the PFET region. The method may also include forming the first channel material into stacked nanosheets, resulting in a stacked nanosheet channel in the NFET region.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIGS. 9A-9C depict various cross-sectional views of a ninth intermediate step of forming a hybrid semiconductor cell, according to some embodiments.

Figure 1:
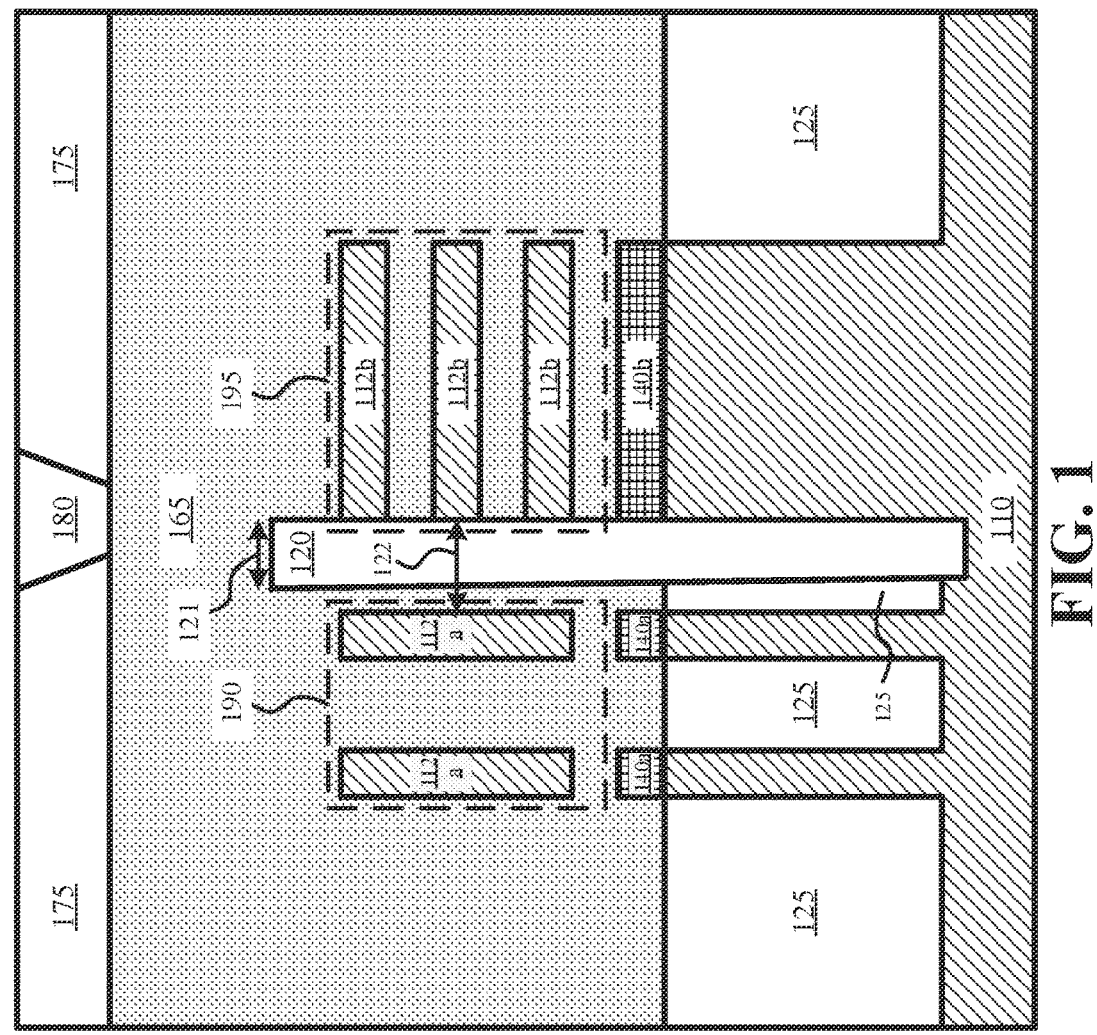
FIG. 1 depicts a schematic diagram of an example hybrid semiconductor cell, according to some embodiments.
Figure 1:
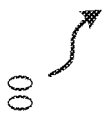

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relates to semiconductors and transistors and, more specifically, to hybrid fin and nanosheet architectures within the transistor. While the present disclosure is not necessarily limited to such applications, various aspects of the disclosure may be appreciated through a discussion of various examples using this context.

Transistors, such as field-effect transistors (FETs), may be used within a system (for example, within a semiconductor) to switch or amplify electric current or voltage. FETs may have two typical configurations, N-channel FETs and P-channel FETs. N-channel FETs introduce (for example, through doping) an n-type impurity to the semiconductor material of the channel between the source and the drain, and P-channel FETs introduce a p-type impurity to the semiconductor material of the channel.

For n-type impurities, arsenic, phosphorous, or any other n-type material may be added to the silicon. N-type materials may have five electrons in their outer orbitals. When the n-type materials are combined with the silicon of the semiconductor, the fifth electron may not have anything to bond to and may freely move around, which may allow an electric current to flow through the silicon semiconductor channel and the extra electrons (i.e., the electron charge carriers). Because there are extra electrons from the n-type materials, the majority carrier/charge carrier for N-channel FETs are electrons.

In P-channel FETs, p-type impurities such as boron, gallium, etc. may be added to the silicon semiconductor(s) for the silicon doping. The p-type materials may have three electrons in their outer orbitals which, when added to silicon, may form holes (i.e., may lack electrons) in the valence bonds of the silicon atoms. Because there are holes in the valence bonds due to the p-type materials, the majority carrier/charge carrier for P-channel FETs are holes. An N-channel FET may be referred to herein as an NFET and a P-channel FET may be referred to herein as a PFET.

In some instances, it may be beneficial to have multiple FETs connected to each other. For example, in logic gate designs, an N-gate from an NFET may be electrically connected to a P-gate from a PFET in order to form an input for the logic gate. A logic gate may be a circuit with one or more inputs (for example, any number of inputs), but only one output.

Devices such as planar devices may not be able to suppress short channel effects, therefore a three-dimensional gate structure which wraps around the channel(s) may be desired, as it may give more gate control to suppress short channel effects. Further, all sides of a channel may have better exposure to the field of the gate, which may result in better current flow through the channel(s). Both finFETs and nanosheets may have gate structures that fully wrap around the channel(s). Therefore, in some conventional semiconductors, finFETs have been utilized for both the NFET and PFET. However, as technology has progressed and as devices and semiconductors have gotten increasingly smaller, conventional semiconductors have transitioned more to nanosheet transistors for both the NFET and PFET. For instance, some finFETs may only have a narrow, tall vertical channel for current to flow through. Further, with devices becoming increasingly smaller, the transistors (such as finFETs) have also gotten increasingly smaller, however finFETs may become less and less effective at these increasingly small sizes. While a nanosheet transistor may have a larger width than a finFET, as a nanosheet transistor includes horizontally stacked nanosheets, a nanosheet transistor can include multiple nanosheets stacked on top of each other. Therefore, even though a nanosheet transistor may have a larger width than a finFET, the nanosheet transistor may have multiple channels within that width/area. This may allow a nanosheet transistor to have more channels, and therefore more current flow, than a finFET would within that same width/area.

However, nanosheet transistors may still have difficulties. For instance, in a conventional nanosheet transistor, in order to allow for source/drain patterning and work function metal patterning, there may need to be a wide separation between the NFET region and the PFET region, which may be bad for scaling. To help reduce the space between the NFET region and the PFET region, a dielectric bar may be formed between the regions. The dielectric bar may help prevent NFET source/drain shorting to the PFET source/drain, and may also help prevent work function metal undercut. However, when using a dielectric bar (for example, a forksheet) for both the NFET and PFET regions, the carrier mobilities may not be optimized. For example, horizontally oriented nanosheets may be beneficial for electron mobility, and therefore may be beneficial for the NFET region, but may not be good for hole mobility or the PFET region. Instead, a fin architecture may be favorable for hole mobility.

The present disclosure provides a semiconductor, a system, and a method of forming a hybrid semiconductor cell. The hybrid semiconductor cell, also referred to herein as a hybrid semiconductor and/or a hybrid semiconductor structure, may include both fin and nanosheet transistors within the semiconductor. Specifically, a finFET and a nanosheet transistor may be connected to each other (for example, to form a logic gate design). As discussed herein, a nanosheet transistor architecture may be beneficial as a PFET and a finFET may be beneficial as an NFET. Therefore, the hybrid semiconductor may include a PFET with a nanosheet transistor architecture and an NFET with a finFET architecture (also referred to herein as a fin architecture).

However, in conventional systems, the NFET and PFET may need to be distanced from each other in order for both the NFET and PFET to effectively function and not negatively affect the other. The space between the NFET region and PFET region of a semiconductor may be referred to herein as N2P space. As technology advances, it has become more and more beneficial to have large amounts of technology and components in very small spaces. Therefore, it may be advantageous to reduce the N2P space and bring NFET(s) and PFET(s) closer together. Thus, the hybrid semiconductor structure discussed herein may further include an isolation bar (for example, a dielectric isolation bar) between the NFET and PFET regions. The isolation bar may help isolate the NFET and PFET so that they cannot negatively affect each other, which may allow the NFET and PFET to be closer together and may reduce the N2P space. For instance, the isolation bar may help prevent source/drain epitaxy shorts and gate/work function metal undercut.

Referring now to FIG. 1, a schematic diagram of an example hybrid semiconductor cell 100 is depicted, according to some embodiments. A hybrid semiconductor cell 100, as referred to herein, refers to a structure with a single NFET and a single PFET. A semiconductor and/or device may include any number of hybrid semiconductor cells 100. As depicted in FIG. 1, hybrid semiconductor cell 100 includes a PFET region 190 and an NFET region 195 separated by an isolation bar 120. An isolation bar 120, as discussed herein, allows the PFET region 190 and NFET region 195 to be closer together, therefore reducing the amount of N2P space 122. The N2P space may be the space between the PFET region (190) fin 112a and the NFET region (195) nanosheet 112b that are closest together (i.e., nearest each other). In a conventional semiconductor, the N2P space may need to be greater than 40 nm in order to prevent adverse effects. However, in hybrid semiconductor cell 100, for instance, the N2P space 122 may be as small as 20 nm. (i.e., greater than or equal to 20 nm).

The isolation bar 120 may be materials such as silicon nitride (SiN), silicon oxycarbonitride (SiOCN), SiBCN, silicon oxycarbide (SiOC), silicon carbide (SiC), etc. In some instances, the isolation bar may have a top critical dimension (depicted in FIG. 1 as dimension 121) of as small as 12 nanometers (nm). Although isolation bar 120 is depicted as having a height spanning from substrate 110 past channels 112a and 112b, isolation bar 120 may have other sizes/heights as well. In some instances, the isolation bar 120 may need to have a height greater than or equal to channels 112a and/or channels 112b in order to effectively isolate channels 112a from channels 112b (and the PFET region 190 from the NFET region 195). In some instances, the isolation bar 120 may be directly connected to the channels 112b (i.e., the NFET channels). Directly connected to, as referred to herein, may refer to components having direct contact with each other. Having the isolation bar directly connected to the channels 112b may help minimize the necessary space between the NFET region 195 and PFET region 190 (for instance, minimizing the space necessary to avoid the NFET and PFET negatively affecting each other), as there may be no unnecessary extra space between the isolation bar and the channels 112b. As depicted in FIG. 1, isolation bar 120 may also be directly connected to bottom dielectric isolation 140b and substrate 110. The isolation bar 120 may not be attached directly to a channel 112a, as attaching the isolation bar 120 to channel 112a may cause the channel 112a and the corresponding PFET region 190 to no longer function as a finFET, as there may not be any gate control over a major surface, and instead function as a planar device with poor short channel control.

Hybrid semiconductor cell 100 includes a substrate 110. Substrate 110 may be a silicon substrate, in some instances.

In some instances, as depicted in FIG. 1 and discussed further herein, portions of the substrate 110 may be patterned and any open spaces from the patterning/etching may be filled by dielectric 125. Dielectric 125 may be $SiO_2$, SiN, or any other dielectric. In some instances, dielectric 125 is formed through shallow trench isolation (STI). Specifically, trenches—or any other open space—may be carved/etched in substrate 110 and the dielectric 125 may be deposited in these open spaces. The substrate 110 may be separated from the PFET and NFET regions (190 and 195, respectively) by dielectric 140a and 140b, for example though bottom dielectric isolation (BDI). Dielectric 140a and 140b may be referred to collectively herein as BDI 140 or as dielectric 140. BDI may include materials such as SiN, SiBCN, SiOCN, SiOC, etc. In some instances herein, substrate 110 may be referred to as being below the PFET region 190 and the NFET region 195 and/or the PFET and NFET regions (190 and 195, respectively) may be described as being above the substrate 110. Above, as used herein, may refer to a component, portion of a component, layer, etc. that was filled after another component, portion of a component, layer, etc. and/or that appears on top of another component, portion of a component, layer, etc. when looking at a cross-sectional view such as the views depicted in FIGS. 1 and 2B-16C. Below, as used herein, may refer to a component, portion of a component, layer, etc. that was filled before another component, portion of a component, layer, etc. and/or that appears on bottom of (i.e., below) another component, portion of a component, layer, etc. when looking at a cross-sectional view such as the views depicted in FIGS. 1 and 2B-16C.

The PFET region 190 of hybrid semiconductor cell 100 includes two vertical channels 112a. Although two channels are depicted, the PFET region 190 may include any number of channels 112a. Channels 112a may be in a finFET structure as the channels 112a are in a fin shape (as the channels are vertically oriented and are tall and narrow). The NFET region 195 of the hybrid semiconductor cell 100 may have a nanosheet transistor structure, and includes nanosheets 112b. Although NFET region 195 includes three nanosheets 112b, any number of nanosheets 112b may be used. These horizontally oriented nanosheets 112b may act as channels for the NFET region 195, and may also be referred to herein as channels 112b.

Hybrid semiconductor cell 100 also includes gate 165. Gate 165 may be include a work function metal (WFM) in some instances. In some instances, gate 165 includes a gate insulator (such as $SiO_2$, HfLaOx, HfAlOx, etc.) and gate metals (including WFMs and, in some instances, optional conductive metals such as tungsten (W)). As depicted in FIG. 1, gate 165 may surround various sidewalls of the channels 112a and 112b. Gate 165 may act as a gate for both the PFET region 190 and the NFET region 195 of the hybrid semiconductor cell 100. In some instances, as depicted in FIG. 1, hybrid semiconductor cell 100 has a shared gate that is shared between both the PFET 190 and the NFET 195. For instance, hybrid semiconductor cell 100 includes a single interconnect 180 to connect to the gate 165 and the PFET and NFET regions (190 and 195, respectively). Although FIG. 1 depicts a shared gate, hybrid semiconductor cell 100 may include a separated gate, in some instances. A separated gate is discussed further herein and depicted in FIG. 16A. Hybrid semiconductor cell 100 includes dielectric 175 to help protect the gate 165 and the interconnect 180 and prevent any unwanted heat and/or current transfer between these components and other components of the semiconductor device (not depicted). In some instances, dielectric 175 may be silicon oxide (SiO$_2$).

Referring now to FIGS. 2A-16C, FIGS. 2A-15C may depict intermediate steps in the process of forming hybrid semiconductor cell 1600. FIGS. 16A-16C depict the fully formed hybrid semiconductor cell 1600. Although FIGS. 2A-15C are discussed in relation to hybrid semiconductor cell 1600 (FIGS. 16A-16C), the same/similar steps may be used to form hybrid semiconductor cell 100 (FIG. 1), in some instances.

Figure 2B:
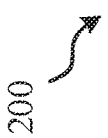
FIG. 2B depicts a cross-sectional view of a first intermediate step of forming a hybrid semiconductor cell, according to some embodiments.
Figure 2B:
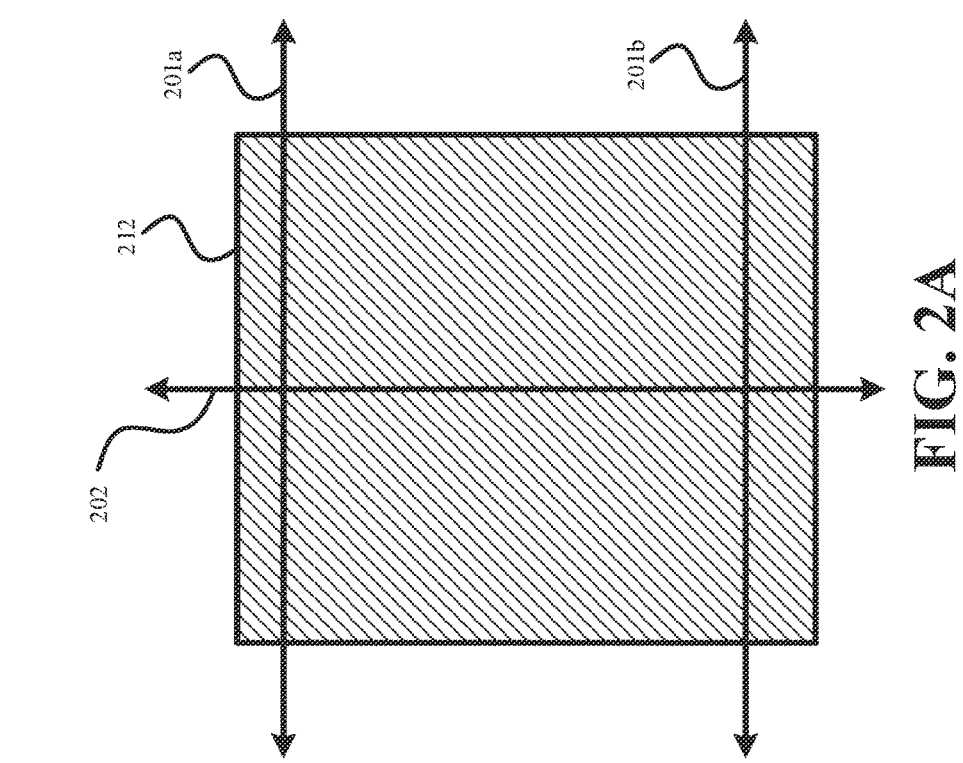
Figure 2A:
FIG. 2A depicts a top down view of a first intermediate step of forming a hybrid semiconductor cell, according to some embodiments.

Referring to FIG. 2A, a schematic diagram of a top down view of a first intermediate step 200 of forming a hybrid semiconductor cell is depicted, according to some embodiments. The top down view of intermediate step 200 includes a nanosheet channel layer 212. As discussed and referred to herein, FIGS. 2B-16C may reference various cross-sectional views of the hybrid semiconductor cell. The locations of these various cross-sections are depicted in the top down view of FIG. 2A. Specifically, the cross-sectional views include a y view 202 (also referred to herein as a y-cross section), an x1 view 201a (also referred to herein as x1 cross-section), and an x2 view 201b (also referred to herein as x2 cross-section). For instance, a y cross-section may be a cross-section taken at the y dimension/view 202, an x1 cross-section may be a cross-section taken at the x1 dimension/view 201a, and an x2 cross-section may be a cross-section taken at the x2 dimension/view 201b.

Referring now to FIG. 2B, a y cross-sectional view of a first intermediate step 200 of forming a hybrid semiconductor cell is depicted, according to some embodiments. As discussed herein, a y cross-section may be a cross section at the y dimension/view 202 (FIG. 2A). Intermediate step 200 may include forming the initial substrate/layers of the semiconductor cell. For instance, intermediate step 200 may include forming bottom sacrificial layer 211 above substrate 210, and then forming alternating layers of sacrificial nanosheet layer 215 and nanosheet channel layers 212. The nanosheet channel layers 212 may become nanosheets/channels 212 in an NFET region of the hybrid semiconductor (discussed further herein). In some instances, substrate 210 corresponds to substrate 110 (FIG. 1). Substrate 210, bottom sacrificial layer 211, sacrificial nanosheet layers 215, and nanosheet channel layers 212 may be deposited through conventional epitaxy process(es).

In some instances, substrate 210 may be a silicon material (i.e., a material containing silicon). Nanosheet channel layers 212 may be semiconductor material(s) containing silicon, in some instances. In some instances, nanosheet channel layers 212 may be the same material(s) as substrate 210. In some instances, nanosheet channel layers 212 may be different material(s) than substrate 210. In some instances, substrate 210 and/or nanosheet channel layers 212 may contain other materials, such as germanium, etc., instead of silicon. In some instances, substrate 210 and/or nanosheet channel layers 212 may contain a combination of materials (i.e., compounds), such as gallium arsenide (GaAs), etc. In some instances, while both bottom sacrificial layer 211 and sacrificial nanosheet layers 215 may be sacrificial layers, layers 211 and 215 may be different materials and/or different amounts of materials. For instance, both bottom sacrificial layer 211 and sacrificial nanosheet layer 215 may be silicon germanium (SiGe), however they may be silicon germanium alloys with different germanium concentrations. For example, bottom sacrificial layer 211 may be SiGe55 (with 55% germanium) and sacrificial nanosheet layer 215 may be SiGe30 (with 30% germanium). By using different Ge % for layer 211 and layers 215, bottom sacrificial layer 211 may be selectively removed (discussed further herein) without removing layers 215.

Figure 3:
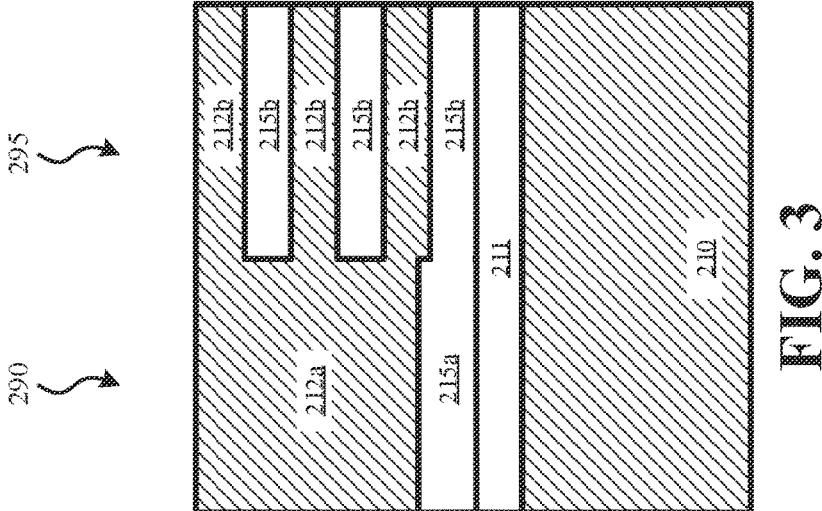
FIG. 3 depicts a cross-sectional view of a second intermediate step of forming a hybrid semiconductor cell, according to some embodiments.
Figure 3:
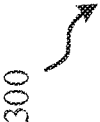

Referring now to FIG. 3, a y cross-sectional view (i.e., a cross-sectional view from the y dimension 202 (FIG. 2A)) of a second intermediate step 300 of forming a hybrid semiconductor cell is depicted, according to some embodiments. In intermediate step 300, nanosheet stacks in the PFET region 295 (including sacrificial nanosheet layers 215) may be patterned/etched in order to remove portions of each layer. For instance, the left portions (when viewing from the y cross-sectional view depicted in FIG. 3) of the nanosheet stack may be removed until the bottom most sacrificial nanosheet layer 215 is exposed. Then, an epitaxy process may be used to grow a fresh sacrificial layer 215a and channel layer 212a in the PFET region 290. Although the height of the sacrificial layer 215a is depicted as being higher than sacrificial nanosheet layer 215b, this is just an example height of the sacrificial layer 215a. For example, in some instances, the sacrificial layer 215a may have a same/similar height as sacrificial nanosheet layer(s) 215b.

The left and right portions of the hybrid semiconductor cell may be referred to herein as the PFET region 290 and the NFET region 295. For instance, the left portion of the cell may become the PFET region/portion of the cell and the right portion of the cell may become the NFET portion/region. In addition, to help with simplicity and clarification (particularly in later figures), the portions of materials (such as sacrificial nanosheet layers 215 and channel layers 212) in the PFET region 290 of the cell may be labeled with an "a" (i.e., 215a and 212a) and the portions of materials in the NFET region 295 may be labeled with a "b" (i.e., 212b and 215b). Therefore, sacrificial nanosheet layers 215b may be the portions of the sacrificial nanosheet layers 215 (FIG. 2B) that remain (for example, after patterning/etching) and that are located in the NFET region 295.

Figure 4:
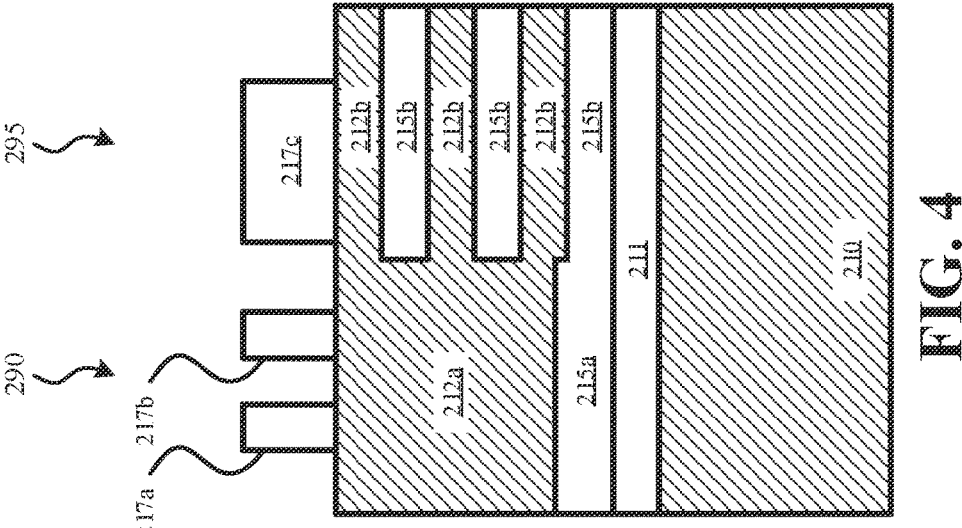
FIG. 4 depicts a cross-sectional view of a third intermediate step of forming a hybrid semiconductor cell, according to some embodiments.
Figure 4:

Referring now to FIG. 4, a y cross-sectional view of a third intermediate step 400 of forming a hybrid semiconductor cell is depicted, according to some embodiments. Intermediate step 400 may include depositing a hard mask 217a, 217b, and 217c (referred to collectively as hard mask 217). Hard mask 217 may protect channel layers 212a and 212b and may prevent them from being unintentionally etched or removed. In some instances, hard masks 217a and 217b may be used to help form the channels in the PFET region 290 and hard mask 217c may be used to help form the channels in the NFET region 295 (discussed and depicted further herein).

In some instances, a single layer of hard mask 217 may be deposited directly onto channel layers 212a and 212b and then the hard mask may be patterned/etched to form hard masks 217a, 217b, and 217c. In some instances, hard masks 217a, 217b, and 217c may be selectively deposited onto channel layers 212a and 212b.

Figure 5:
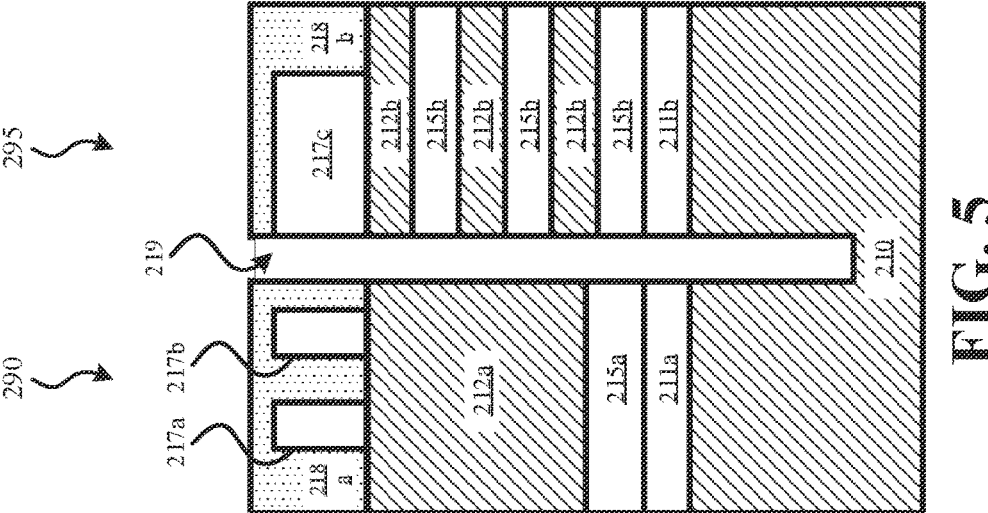
FIG. 5 depicts a cross-sectional view of a fifth intermediate step of forming a hybrid semiconductor cell, according to some embodiments.
Figure 5:

Referring to FIG. 5, a y cross-sectional view of a fifth intermediate step 500 of forming a hybrid semiconductor cell is depicted, according to some embodiments. Intermediate step 500 may include depositing masks 218a and 218b (such as organic planarization layer(s) (OPL)) around hard masks 217a, 217b, and 217c. Masks 218a and 218b may be referred to collectively as masks 218. In some instances, the masks 218 may help protect the hard masks 217 from unwanted etching. In some instances, mask 218a may surround/cover the exposed portions of hard masks 217a and 217b. In some instances, mask 218b may surround/cover most exposed portions of hard mask 217c, but may leave a side of the hard mask 217c (for instance, the side closest to the PFET region 290) exposed, as this portion of the hard mask 217c may be in direct contact with the resulting isolation bar (discussed further herein). Intermediate step 500 may further include patterning a trench 219 between the PFET region 290 and the NFET region 295 of the semiconductor cell. In some instances, the trench 219 may have a top critical dimension of as small as (for instance, greater than or equal to) 12 nm. This top critical dimension may be the width at the top portion of the trench 219 (for example, similar to critical dimension 121 from FIG. 1). Although the trench 219 is depicted as having a same/similar width throughout the trench 219, trench 219 may be tapered, for example in a same/similar shape as isolation bar 120 (FIG. 1). Additionally, as bottom sacrificial layer 211 is now divided by the trench 219, bottom sacrificial layer 211 may be divided into bottom sacrificial layer 211a (the bottom sacrificial layer 211 in the PFET region 290 of the semiconductor cell) and bottom sacrificial layer 211b (the bottom sacrificial layer 211 in the NFET region 295 of the semiconductor cell).

Figure 6:
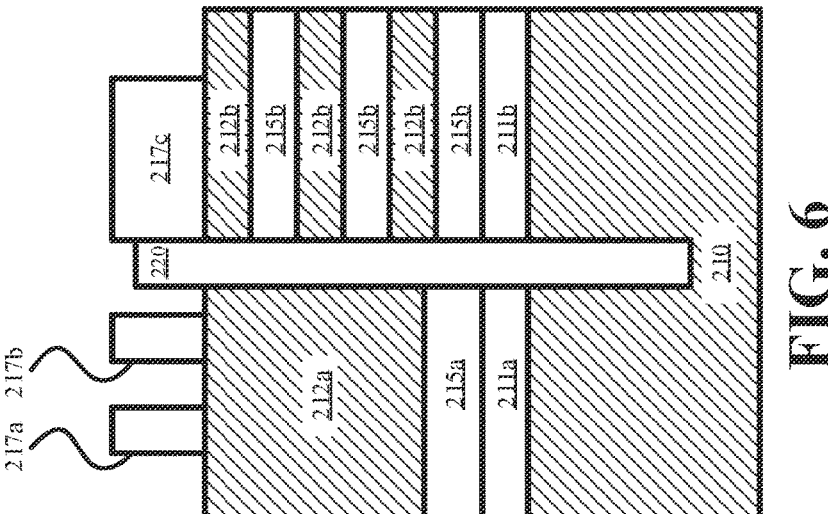
FIG. 6 depicts a cross-sectional view of a sixth intermediate step of forming a hybrid semiconductor cell, according to some embodiments.
Figure 6:
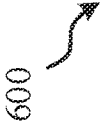

Referring to FIG. 6, a y cross-sectional view of a sixth intermediate step 600 of forming a hybrid semiconductor cell is depicted, according to some embodiments. Intermediate step 600 may include forming the isolation bar 220. Forming the isolation bar 220 may include filling the trench 219 with dielectric (for example, such as SiC, SiOC, SiOCN, etc.). In some instances, the dielectric may be recessed (for instance, through etching). For example, the initial deposition of dielectric that fills the trench 219 may result in dielectric that is taller than hard masks 217. However, this may take up unnecessary space, as the isolation bar 220 may not need to be that tall in order to effectively isolate the PFET and NFET. Therefore, the dielectric may be recessed (for example, through selective etching). In some instances, as depicted in FIG. 6, the dielectric may be recessed to a height above the channel layers 212a and 212b. In some instances, the dielectric may be recessed to a same height/level as the channel layers 212a and 212b. The isolation bar 220 may be the dielectric after it has been recessed, in some instances. In some instances, isolation bar 220 may be a same/similar shape as isolation bar 120 (FIG. 1) with a slightly tapered side.

In some instances, as depicted in FIG. 6, intermediate step 600 may further include removing the mask(s) 218, as they may no longer be needed to protect hard masks 217. The mask(s) 218 may be removed through ashing, in some instances.

Figure 7:
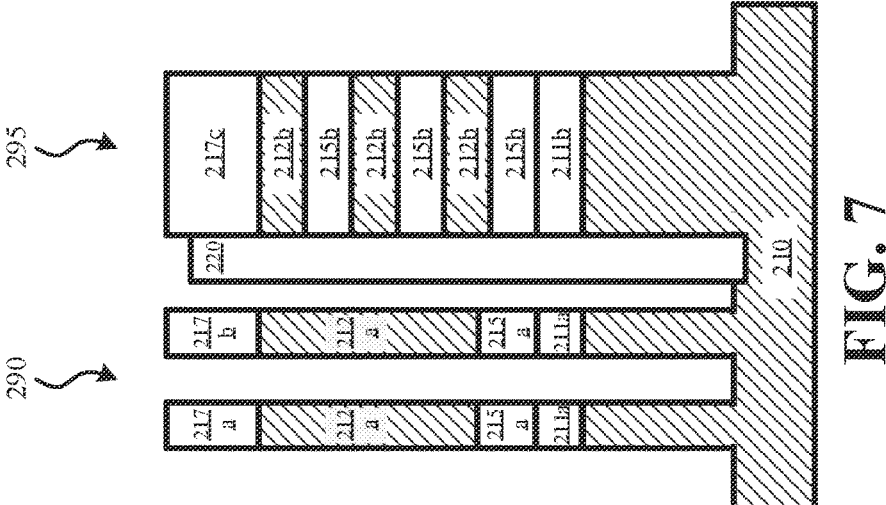
FIG. 7 depicts a cross-sectional view of a seventh intermediate step of forming a hybrid semiconductor cell, according to some embodiments.
Figure 7:

Referring to FIG. 7, a y cross-sectional view of a seventh intermediate step 700 of forming a hybrid semiconductor cell is depicted, according to some embodiments. Intermediate step 700 may include patterning/shaping the PFET region 290 and NFET region 295 of the semiconductor cell. Specifically, the PFET region 290 may be patterned into its fin shape and the NFET region 295 may be patterned into its nanosheet shape. For instance, intermediate step 700 may include patterning the exposed portions (i.e., the portions not covered by hard masks 217) of the channel layers 212a and 212b, the sacrificial nanosheet layers 215a and 215b, the bottom sacrificial layers 211a and 211b, and the substrate 210. In some instances, the patterning may be done using reactive ion etching (RIE), ion beam etching (IBE), or any other patterning/etching process.

After the patterning, the PFET region 290 may be shaped in a fin shape with two tall, narrow vertical fins. Although this exemplary process includes two vertical fins, any number of fins may be included in a semiconductor cell. In some instances, the fin and the channel layer 212a closest to the isolation bar 220 may be approximately 6 nm to 15 nm from the isolation bar. After patterning the NFET region 295, the NFET region 295 may include a wider structure that will become nanosheet layers. For example, the nanosheet channel layers 212b may become nanosheets (and may be referred to herein as nanosheets 212b). Therefore, hard mask 217c may be the width, height, and depth of the resulting nanosheets 212b, as the hard mask 217c is used to shape the nanosheets 212b.

Figure 8:
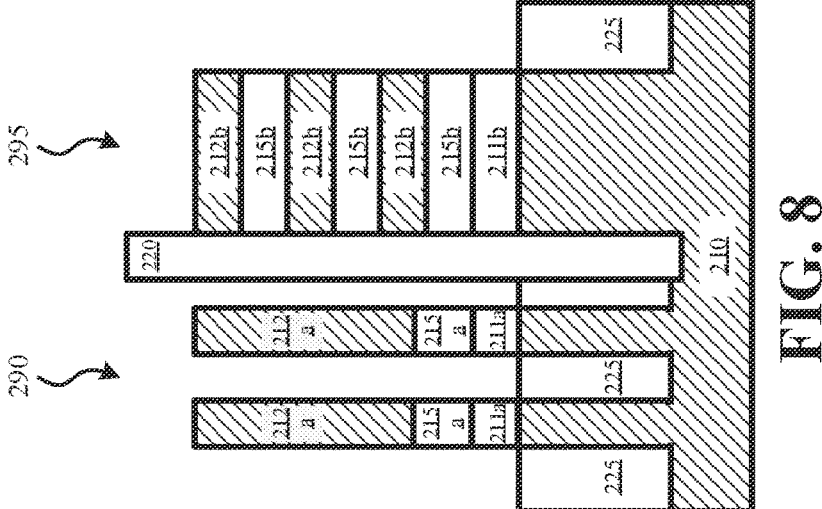
FIG. 8 depicts a cross-sectional view of an eighth intermediate step of forming a hybrid semiconductor cell, according to some embodiments.
Figure 8:

Referring to FIG. 8, a y cross-sectional view of an eighth intermediate step 800 of forming a hybrid semiconductor cell is depicted, according to some embodiments. Intermediate step 800 includes depositing dielectric 225 to fill open spaces in the substrate 210 from the patterning/etching. Dielectric 225 may then be polished and recessed to form shallow trench isolation (STI), in some instances. Intermediate step 800 may also include removing hard masks 217 (for example, by selective wet or dry etch).

FIGS. 9A-16C depict three different cross-sectional views for each step of forming (as well as the final formation of) the hybrid semiconductor cell 1600. The cross-sectional view for each "A" figure (i.e., FIGS. 9A, 10A, 11A, 12A, 13A, 14A, 15A, and 16A) depicts a y cross-sectional view of the semiconductor cell. The y cross-sectional view may correspond to the y dimension 202 depicted in FIG. 2A. The cross-sectional view for each "B" figure (i.e., FIGS. 9B, 10B, 11B, 12B, 13B, 14B, 15B, and 16B) depicts an x1 cross-sectional view of the semiconductor cell. The x1 cross-sectional view may correspond to the x1 dimension 201a depicted in FIG. 2A. The cross-sectional view for each "C" figure (i.e., FIGS. 9C, 10C, 11C, 12C, 13C, 14C, 15C, and 16C) depicts an x2 cross-sectional view of the semiconductor cell. The x2 cross-sectional view may correspond to the x2 dimension 201b depicted in FIG. 2A. The x1 cross-sectional view may be a cross-sectional view within the PFET region of the semiconductor cell and the x2 cross-sectional view may be a cross-sectional view within the NFET region of the semiconductor cell, in some instances.

Figures 9A, 9B, 9C:
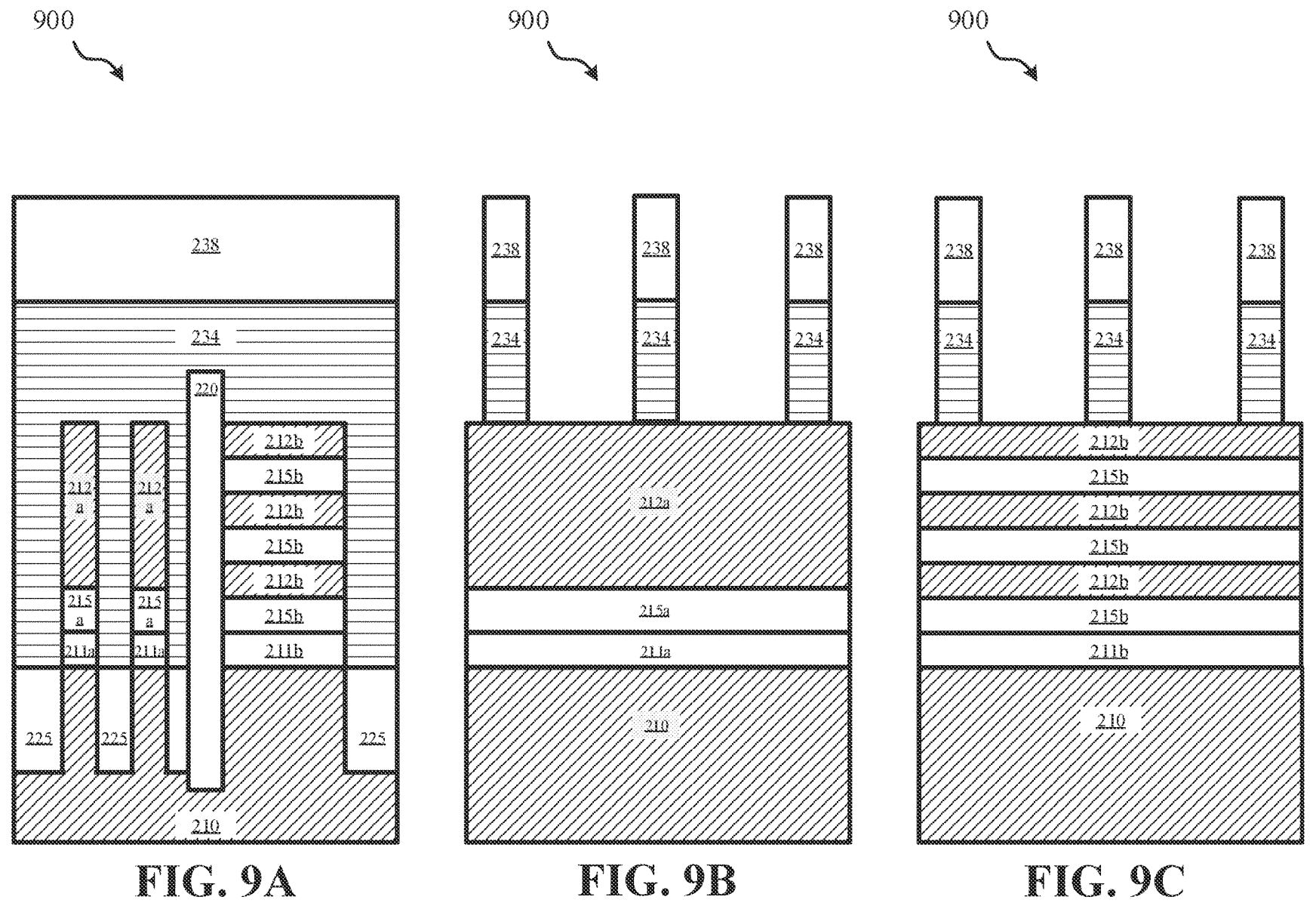

Referring to FIGS. 9A-9C, various cross-sectional views (i.e., a y cross-sectional view, an x1 cross-sectional view, and an x2 cross-sectional view, respectively) of a ninth intermediate step 900 of forming a hybrid semiconductor cell are depicted, according to some embodiments. Intermediate step 900 may include forming/depositing dummy gates 234. Dummy gates 234 may be dummy components that serves as a placeholder for the gate (formed in later steps). The term dummy, as referred to herein, refers to having no functionality. Therefore, the dummy gates 234 may have no functionality and may simply occupy the space for the future gate(s). The dummy gates 234 may be deposited using methods such as atomic layer deposition (ALD), chemical vapor deposition (CVD), laser induced chemical vapor deposition (LCVD), and/or any other applicable deposition technique.

Intermediate step 900 may also include depositing hard masks 238 directly above the dummy gates 234. Above, as used herein, may refer to a component, portion of a component, layer, etc. that was filled after another component, portion of a component, layer, etc. and/or that appears on top of another component, portion of a component, layer, etc. when looking at a cross-sectional view such as the view depicted in FIGS. 1-16C. The hard masks 238 may protect the dummy gates 234 from any unwanted etching. The hard mask 238 and dummy gate 234 are patterned using conventional lithography and etching process.

As depicted in FIGS. 9B and 9C, there may be three dummy gates 234 and hard masks 238. This may leave the space between the dummy gates 234 and hard masks 238 uncovered, which may give space for source/drain (S/D) epitaxial/epitaxy (epi) and other components.

Figures 10A, 10B, 10C:
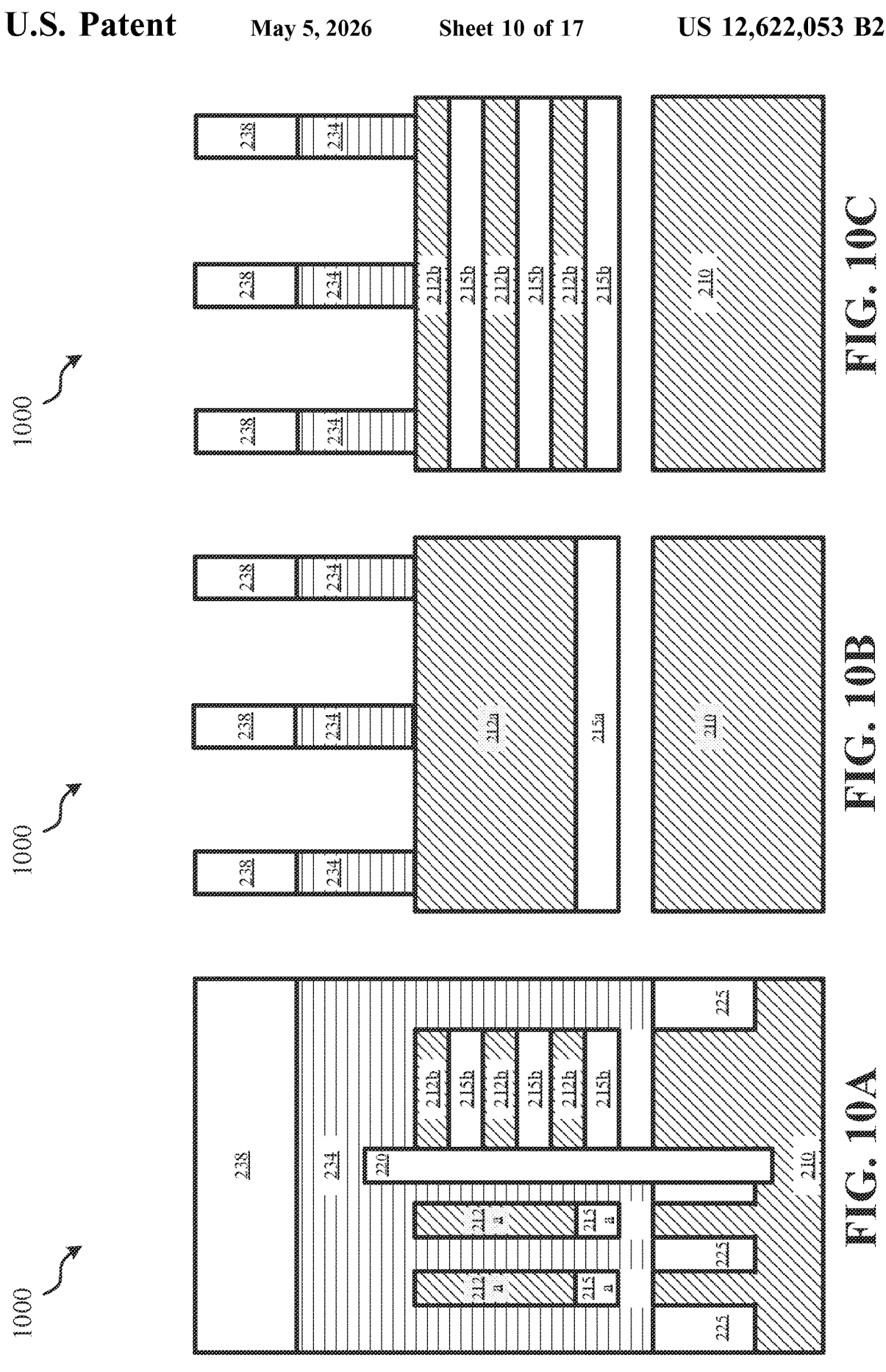
FIGS. 10A-10C depict various cross-sectional views of a tenth intermediate step of forming a hybrid semiconductor cell, according to some embodiments.

Referring to FIGS. 10A-10C, various cross-sectional views (i.e., a y cross-sectional view, an x1 cross-sectional view, and an x2 cross-sectional view, respectively) of a tenth intermediate step 1000 of forming a hybrid semiconductor cell are depicted, according to some embodiments. Intermediate step 1000 includes removing bottom sacrificial layer 211 (i.e., including bottom sacrificial layers 211a and 211b). As discussed further herein, bottom sacrificial layer 211 may be replaced with a bottom dielectric isolation (BDI). Part of this replacement includes removing bottom sacrificial layer 211. As discussed herein, bottom sacrificial layer 211 and sacrificial nanosheet layers 215 may be different materials and/or different alloys. For example, sacrificial nanosheet layers 215 may be SiGe30 and bottom sacrificial layer 211 may be SiGe55. By using different alloys, bottom sacrificial layer 211 may be etched (for example, through selective etching) without etching/disrupting sacrificial nanosheet layers 215. In some instances, the selective etching is performed using a selective wet etch/selective wet removal. In selective etching, the etchant used may be chosen based on the material of the bottom sacrificial layer 211 (which, in some instances, may be SiGe55).

Figures 11A, 11B, 11C:
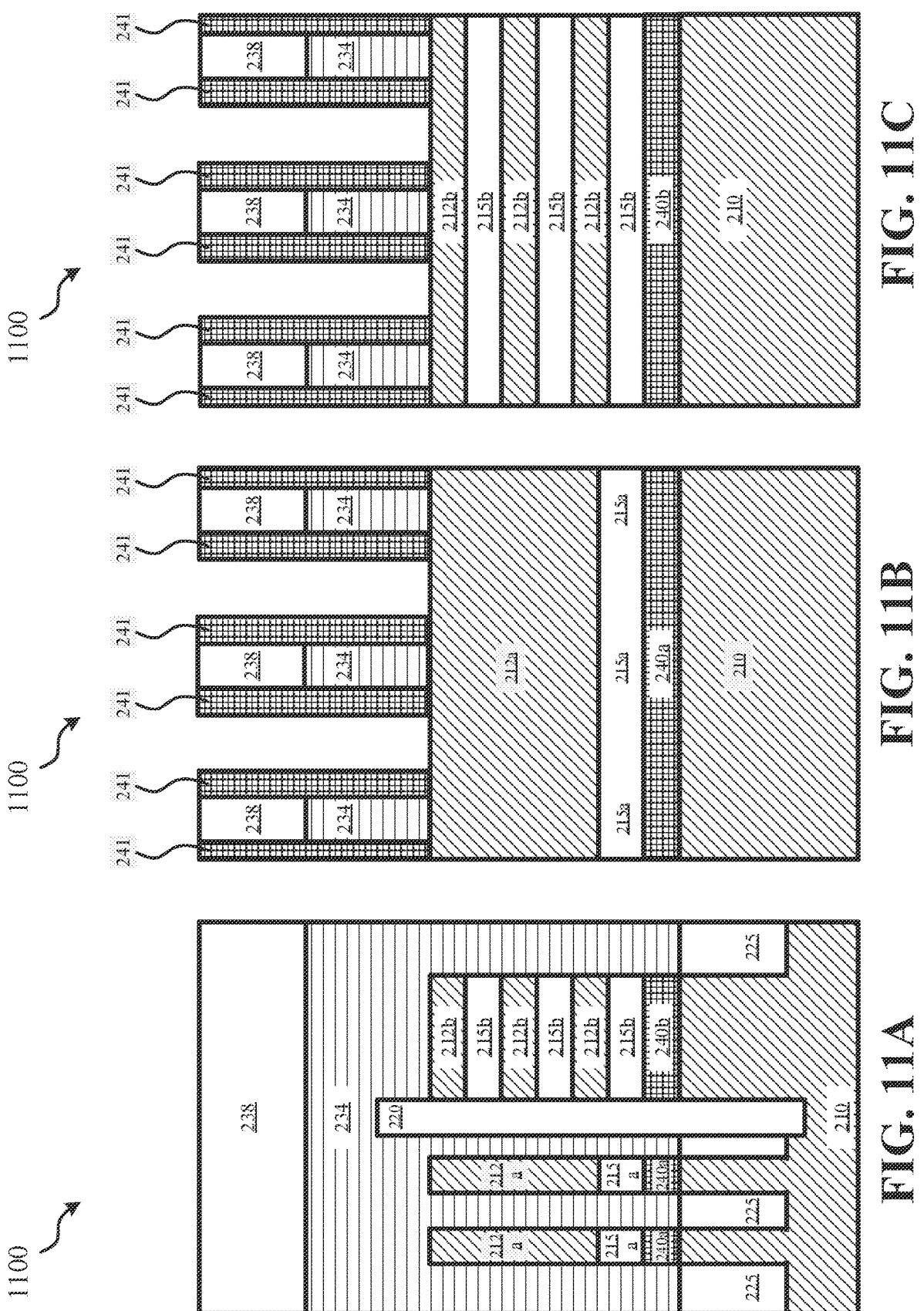
FIGS. 11A-11C depict various cross-sectional views of an eleventh intermediate step of forming a hybrid semiconductor cell, according to some embodiments.

Referring to FIGS. 11A-11C, various cross-sectional views (i.e., a y cross-sectional view, an x1 cross-sectional view, and an x2 cross-sectional view, respectively) of an intermediate step 1100 of forming a hybrid semiconductor cell are depicted, according to some embodiments. Intermediate step 1100 includes depositing bottom dielectric isolation (BDI) 240a and 240b, referred to collectively as BDI 240, into the spaces left from the removal of bottom sacrificial layer 211. Once bottom sacrificial layer 211 has been removed (as depicted in FIGS. 10A-10C), BDI 240 may be deposited in the openings, therefore replacing bottom sacrificial layer 211. In some instances, the BDI 240 may be deposited through selective deposition/using a selective deposition technique. In some instances, bottom sacrificial layer 211 may be accessed for the selective etching through the trenches 251. BDI 240 may be materials such as SIN, SiBCN, SiOCN, SiOC, etc.

Intermediate step 1100 may also include depositing spacers 241. The spacers 241 may be deposited along the sidewalls of the dummy gate(s) 234 and the hard mask(s) 238, in some instances. In some instances, BDI 240 and spacers 241 are deposited together through a conformal dielectric liner deposition process. After deposition, an anisotropic RIE process may be used to remove any excess dielectric liner from horizontal surfaces. In some instances, the spacers 241 may be a same/similar material as BDI 240. BDI 240 and/or spacers 241 may be conformal dielectric liners, in some instances.

Figures 12A, 12B, 12C:
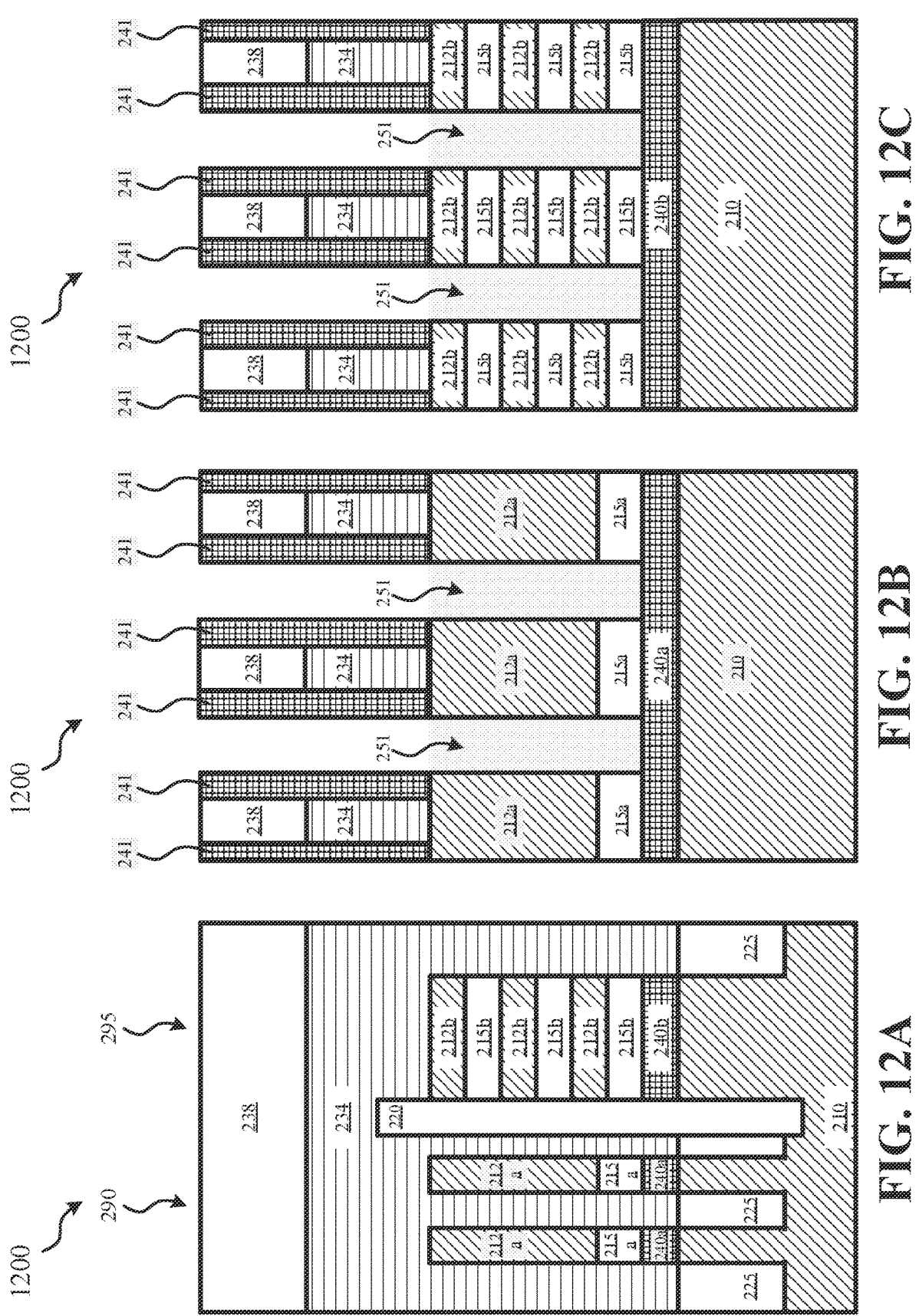
FIGS. 12A-12C depict various cross-sectional views of a twelfth intermediate step of forming a hybrid semiconductor cell, according to some embodiments.

Referring to FIGS. 12A-12C, various cross-sectional views (i.e., a y cross-sectional view, an x1 cross-sectional view, and an x2 cross-sectional view, respectively) of an intermediate step 1200 of forming a hybrid semiconductor cell are depicted, according to some embodiments. Intermediate step 1200 may include recessing the channels 212a and sacrificial nanosheet layers 215a in the PFET region 290 and recessing the stacked nanosheets 212b and sacrificial nanosheet layers 215b in the NFET region 295. Recessing these various layers may include patterning openings/trenches 251 (i.e., extending the openings between the spacers 241) through the channels 212a, sacrificial nanosheet layers 215a, nanosheets 212b, and sacrificial nanosheet layers 215b. In some instances, the trenches 251 may be the same/similar widths as the S/D epitaxial materials (discussed further herein), as the trenches 251 may eventually be filled with the S/D epitaxial materials.

Figures 13A, 13B, 13C:
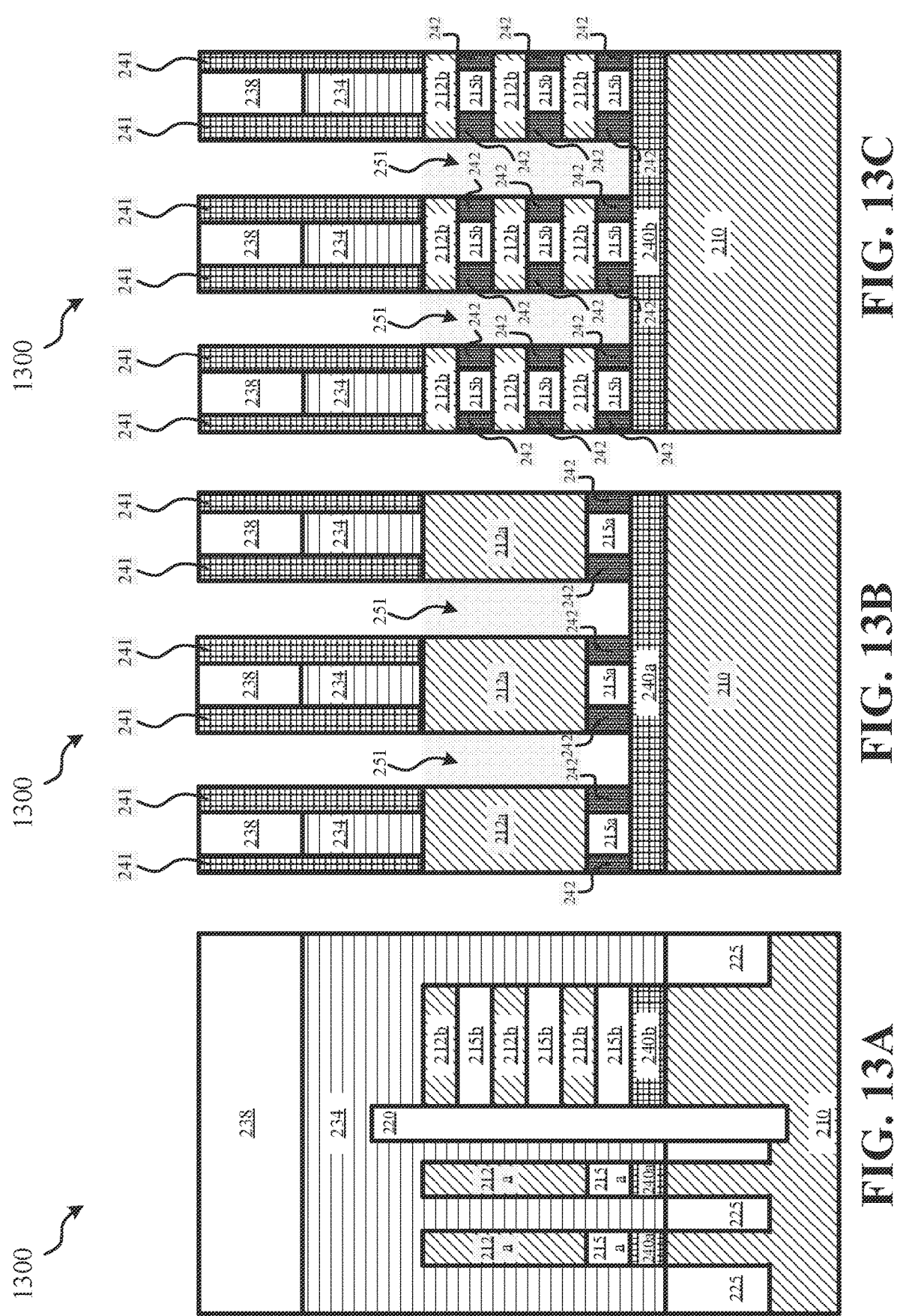
FIGS. 13A-13C depict various cross-sectional views of a thirteenth intermediate step of forming a hybrid semiconductor cell, according to some embodiments.

Referring now to FIGS. 13A-13C, various cross-sectional views (i.e., a y cross-sectional view, an x1 cross-sectional view, and an x2 cross-sectional view, respectively) of an intermediate step 1300 of forming a hybrid semiconductor cell are depicted, according to some embodiments. Intermediate step 1300 may include inserting/depositing spacers 242. In some instances, to insert spacers 242, sacrificial nanosheet layers 215 may be indented (i.e., excess sacrificial nanosheet layers 215 may be removed/etched in order to create openings for the spacers 242), conformal dielectric liner may be deposited, and then an isotropic dielectric liner etch back may be performed to form the spacers 242. In some instances, the spacers 242 may be same/similar material(s) as isolation bar 220. This way, the spacers 242 may help with the isolation of the NFET and PFET.

Figures 14A, 14B, 14C:
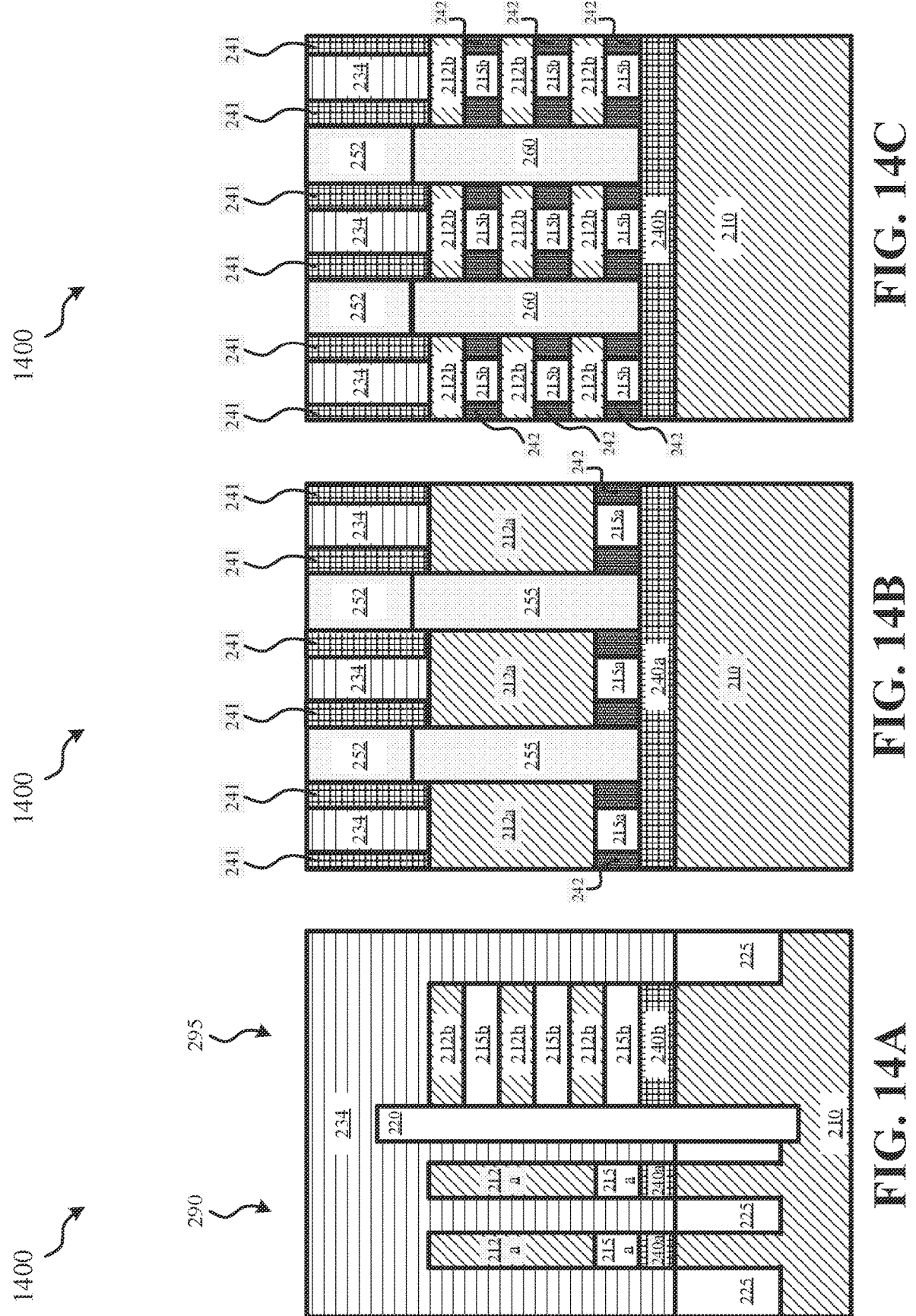
FIGS. 14A-14C depict various cross-sectional views of a fourteenth intermediate step of forming a hybrid semiconductor cell, according to some embodiments.

Referring to FIGS. 14A-14C, various cross-sectional views (i.e., a y cross-sectional view, an x1 cross-sectional view, and an x2 cross-sectional view, respectively) of an intermediate step 1400 of forming a hybrid semiconductor cell are depicted, according to some embodiments. Intermediate step 1400 may include forming source/drain (S/D) epitaxial materials 255 and 260. Epitaxial materials may also be referred to herein as epis and/or epitaxy. S/D epitaxial material 255 may be the S/D epitaxial material for the PFET region 290, and S/D epitaxial material 260 may be the S/D epitaxial material for the NFET region 295. In some instances, S/D epitaxial material 255 and S/D epitaxial material 260 may be different materials and/or alloys. For example, S/D epitaxial material 255 may be boron-doped silicon germanium (SiGe:B) and S/D epitaxial material 260 may be phosphorous-doped silicon (Si:P). In some instances, S/D epitaxial materials 255 and 260 may be formed by growing the epitaxy(s). The epitaxial materials 255 and 260 may be grown through chemical vapor deposition (CVD), vapor-phase epitaxy (VPE), or any other epitaxy growth technique.

In some instances, intermediate step 1400 includes filling open spaces with dielectric. In some instances, different types of dielectric may be used. For instance, as depicted in FIG. 14, the open space above the S/D epitaxial materials 255 and 260 may be filled with dielectric 252 (for example, by selectively depositing dielectric 252). Dielectric 252 may be a dielectric such as $SiO_2$, in some instances. Dielectric 252 may later be removed to make room for other component(s), therefore dielectric 252 may be a material that is somewhat easy to remove, especially without resulting in unwanted removal of other components and dielectric. In some instances, intermediate step 1400 may include removing hard mask(s) 238. Removing hard mask(s) 238 may further include polishing/smoothing the exposed surfaces after the removal (for example, through CMP).

Figures 15A, 15B, 15C:
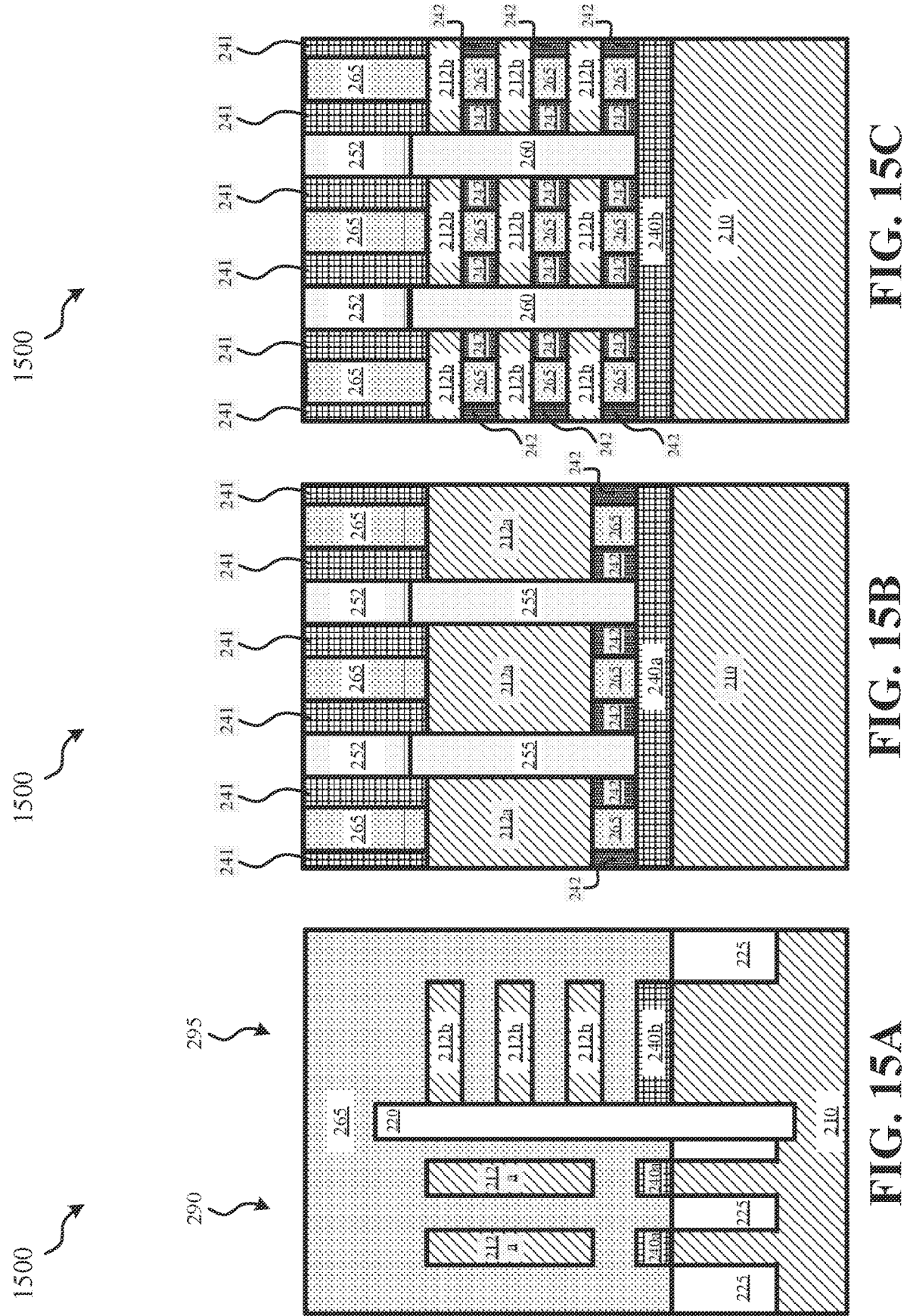
FIGS. 15A-15C depict various cross-sectional views of a fifteenth intermediate step of forming a hybrid semiconductor cell, according to some embodiments.
Figures 16A, 16B, 16C:
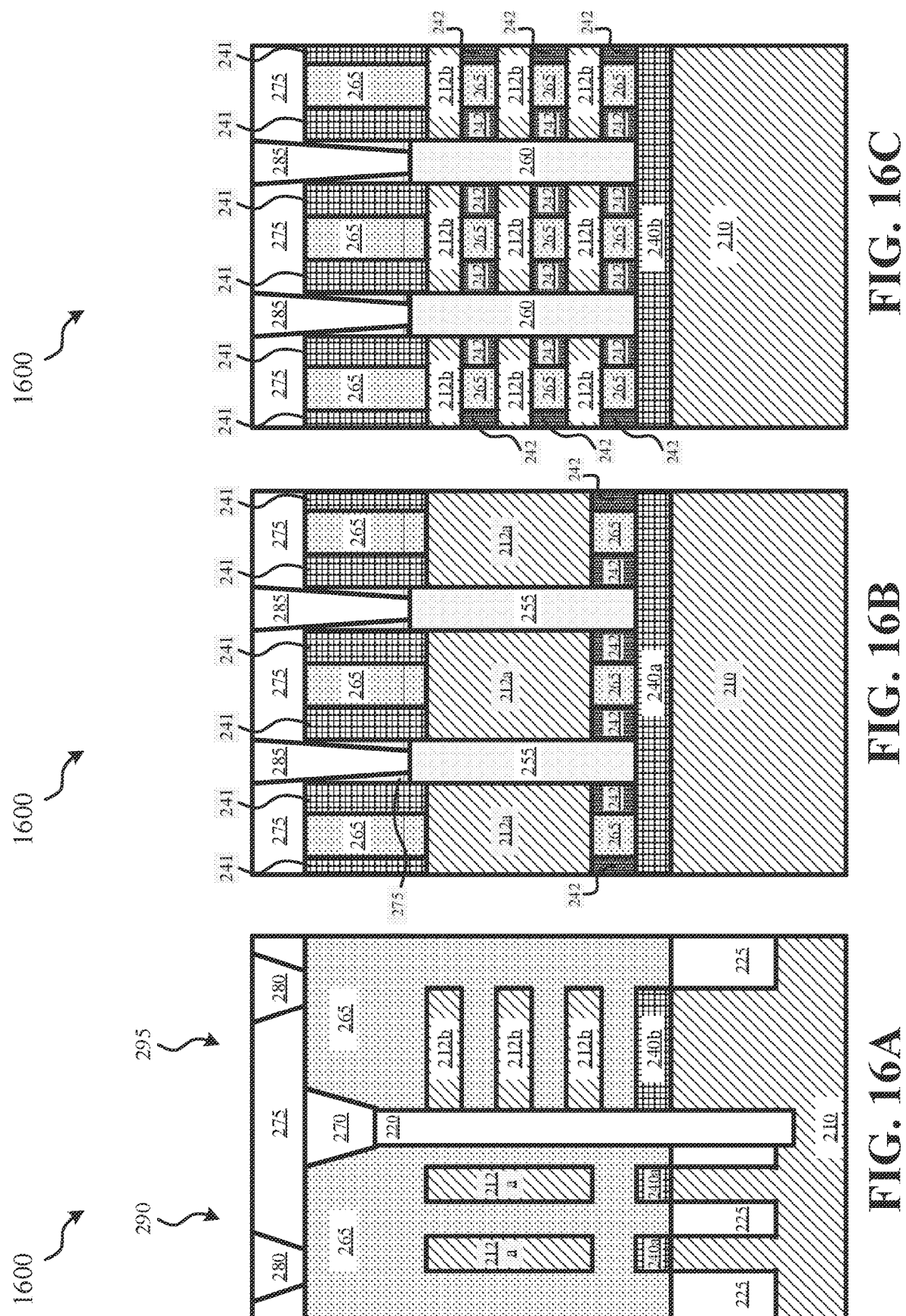
FIGS. 16A-16C depict various cross-sectional views of a fully formed hybrid semiconductor cell, according to some embodiments.

Referring to FIGS. 15A-15C, various cross-sectional views (i.e., a y cross-sectional view, an x1 cross-sectional view, and an x2 cross-sectional view, respectively) of an intermediate step 1500 of forming a hybrid semiconductor cell are depicted, according to some embodiments. Intermediate step 1500 includes replacing dummy gates 234 with gate 265. As discussed herein, dummy gates 234 have been serving as a placeholder, of sorts, for the gate 265. Therefore, intermediate step 1500 may include removing the dummy gates 234 to make room for the gate 265, and then filling the open space with the gate 265. In some instances, dummy gates 234 may be removed through etching. In some instances, gate 265 may be the gate(s) for the PFET region 290 and NFET region 295 of the hybrid semiconductor cell. Gate 265 may correspond to gate 165 from FIG. 1, in some instances. In some instances, sacrificial nanosheet layers 215 may be removed prior to the gate fill in order to fill the spaces with the gate material(s) (i.e., replace sacrificial nanosheet layers 215 with gate 265). In some instances, gate 265 may include a gate insulator (such as $SiO_2$, HfLaOx, HfAlOx, etc.) and gate metals (including WFMs and, in some instances, optional conductive metals such as tungsten (W)).

Referring now to FIGS. 16A-16C, various cross-sectional views (i.e., a y cross-sectional view, an x1 cross-sectional view, and an x2 cross-sectional view, respectively) of a fully formed hybrid semiconductor cell 1600 are depicted, according to some embodiments. FIG. 16A depicts a hybrid semiconductor cell 1600 with a separated gate structure, however this is simply an example gate structure, and a hybrid semiconductor cell can include other types of gate structures, such as the shared gate structure depicted in FIG. 1. If a hybrid semiconductor cell has a shared gate structure, the y cross-sectional view may look the same/similar as the cross-sectional view of hybrid semiconductor cell 100 (FIG. 1). The x1 and x2 cross-sectional views may be the same/similar as the cross-sectional views depicted in FIG. 16B and FIG. 16C.

In hybrid semiconductor cell 1600, a gate cut 270 may be inserted in order to separate the gate 265 to form separate gates 265 for the PFET region 290 and the NFET region 295. Gate cut 270 may be in direct contact with the isolation bar 220 and the dielectric 275, in some instances, in order to make sure the gate 265 is fully separated (by the gate cut 270 and the isolation bar 220). Dielectric 275 may be the same/similar as dielectric 175, in some instances. When the hybrid semiconductor cell 1600 includes separate gates, as depicted in FIG. 16, there may be separate interconnects 280 for each gate 265. In addition, as depicted in FIGS. 16B and 16C, hybrid semiconductor cell 1600 may also include interconnects 285. In some instances, the interconnects 285 may not fill the entire space left by the removal of dielectric 252, therefore any excess space not filled by the interconnects 285 may be filled by dielectric 275 (as depicted in FIG. 16B). In some instances, interconnects 285 may fill the entire space left by the removal of dielectric 252.

Because hybrid semiconductor cell 1600 has a PFET region 290 with a fin structure—as channels 212a are tall, narrow vertical fins—and an NFET region 295 with a nanosheet structure—as channels 212b are horizontally stacked nanosheets, hybrid semiconductor cell 1600 may have a PFET region 290 and an NFET region 295 with structures that are beneficial for their specific channel type (i.e., P-channel(s) and N-channel(s)). This may result in higher hole mobility in the PFET region 290 (compared to a PFET with a nanosheet structure) and a higher electron mobility in the NFET region 295 (compared to an NFET with a fin structure), which may increase the current flow and improve the functioning of the semiconductor cell 1600. In addition, having the isolation bar 220 allows the PFET region 290 and the NFET region 295 to be closer together, therefore reducing the N2P space between the two regions. This may help reduce the size of the semiconductor cell 1600, which may be beneficial as devices and systems are continuously reducing size.

Figure 17:
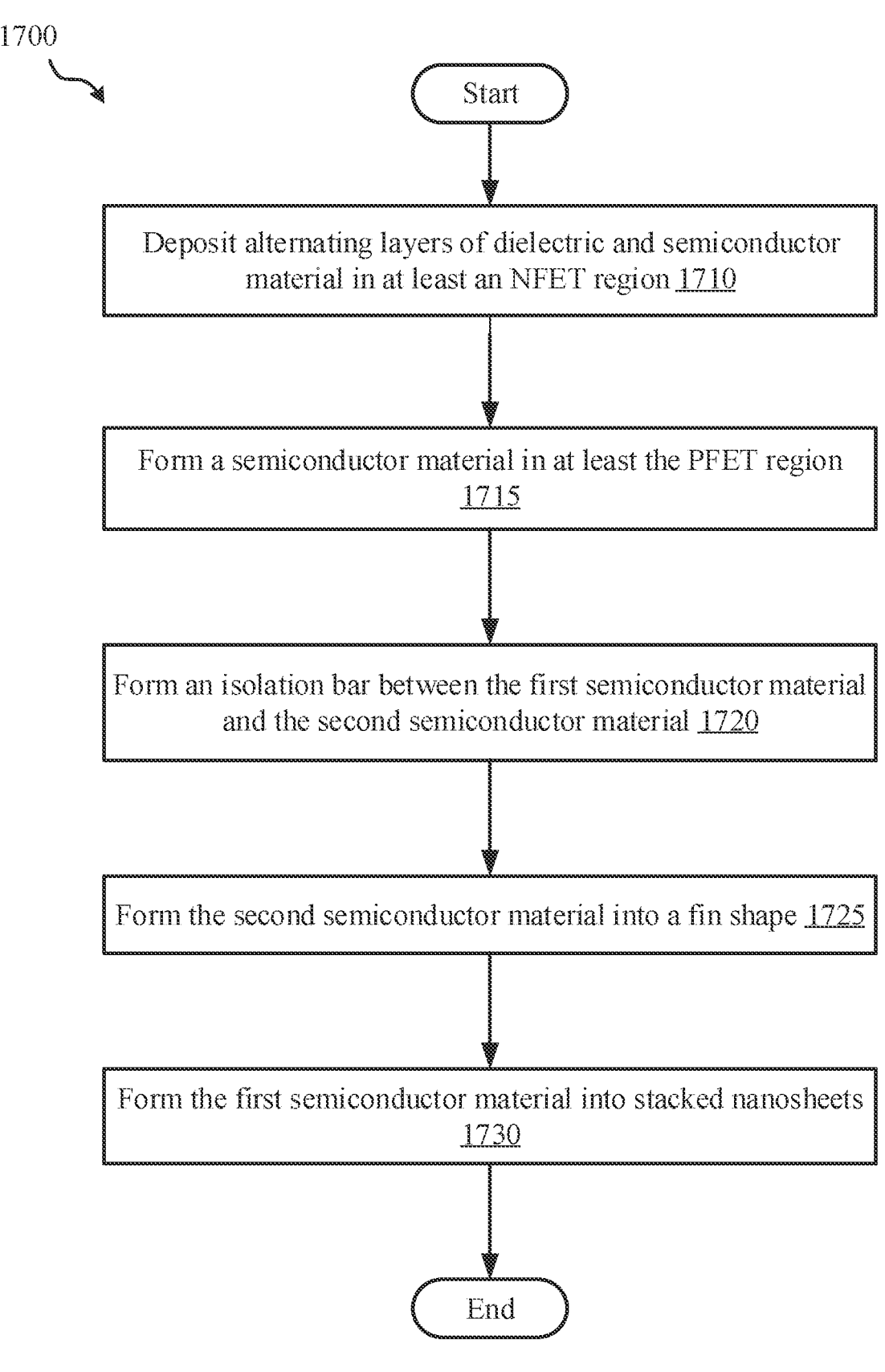
FIG. 17 depicts a flowchart of an exemplary method of forming a hybrid semiconductor cell, according to some embodiments.

Referring now to FIG. 17, a flowchart of an exemplary method 1700 of forming a hybrid semiconductor cell is depicted, according to some embodiments. Method 1700 includes operation 1710 to deposit alternating layers of sacrificial material and channel material in at least an NFET region of a structure. In some instances, operation 1710 corresponds to intermediate step 200 (FIG. 2B). In intermediate step 200, the alternating sacrificial layers (e.g., sacrificial nanosheet layers 215) and channel layers (e.g., nanosheet channel layers 212) may be deposited in both the NFET region and the PFET region. In some instances, the alternating layers may only be deposited in the NFET region and may not be deposited in the PFET region.

Method 1700 includes operation 1715 to form a channel material in at least the PFET region. In some instances, forming the channel material in the PFET region may correspond to intermediate step 300 (FIG. 3), wherein channel layer 212a is grown after the channel layers and sacrificial layers are removed from the PFET region. In some instances, as discussed above, the alternating channel layers and sacrificial layers may only be deposited in the NFET region. In these instances, forming a channel material in the PFET region may include depositing a channel material in the PFET region.

Method 1700 includes operation 1720 to form an isolation bar between the first channel material and the second channel material. In some instances, forming the isolation bar may include patterning a trench through the second channel material, the alternating layers of the first sacrificial material and the first channel material, and at least a portion of a substrate (for instance, as discussed herein and depicted in intermediate step 500 (FIG. 5)). After the trench is patterned, the trench may be filled with a dielectric, resulting in an isolation bar. In some instances, this may correspond to intermediate step 600 (FIG. 6). In some instances, intermediate steps 400 (FIG. 4)-600 (FIG. 6) may all be included in the process of forming the isolation bar.

Method 1700 includes operation 1725 to form the second channel material into a fin shape. Forming the second channel material into a fin shape may include patterning/ shaping the PFET region of structure into a fin shape (for example, as depicted in intermediate step 700 (FIG. 7) in the PFET region 290).

Method 1700 includes operation 1730 to form the first channel material into stacked nanosheets. Forming the first channel material into stacked nanosheets may include patterning/shaping the NFET region of structure into a nanosheet shape (for example, as depicted in intermediate step 700 (FIG. 7) in the NFET region 295). In some instances, forming the first channel material into stacked nanosheets may also include removing the sacrificial layers between the nanosheets (for example, as depicted in intermediate step 1500 (FIG. 15), where sacrificial nanosheet layers 215b has been removed).

In some instances, method 1700 may include additional operations, such as operations corresponding to intermediate step 800 (FIG. 8), intermediate step 900 (FIGS. 9A-9C), intermediate step 1000 (FIGS. 10A-10C), intermediate step 1100 (FIGS. 11A-11C), intermediate step 1200 (FIGS. 12A-12C), intermediate step 1300 (FIGS. 13A-13C), intermediate step 1400 (FIGS. 14A-14C), intermediate step 1500 (FIGS. 15A-15C), hybrid semiconductor cell 1600 (FIGS. 16A-16C), etc.

Additionally, although method 1700 is described as forming a single fin, a single set of stacked nanosheets, etc., any number of fins and stacked nanosheets may be formed.

The present invention may be a system, a method, a computer program product, etc. at any possible technical detail level of integration.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A hybrid semiconductor structure, wherein the hybrid semiconductor structure comprises:
a PFET region, wherein the PFET region comprises a first channel in a vertically oriented fin shape;
an NFET region, wherein the NFET region comprises a second channel, the second channel comprising a horizontally oriented nanosheet;
a shallow trench isolation (STI) region disposed below and between the PFET region and the NFET region; and
an isolation bar separating the PFET region from the NFET region and extending at least one of the first channel and the second channel and extending below the STI region.

2. The hybrid semiconductor structure of claim 1, wherein the isolation bar is connected to the second channel.

3. The hybrid semiconductor structure of claim 2, wherein the isolation bar is further connected to a substrate, wherein the substrate is below the PFET region and the NFET region.

4. The hybrid semiconductor structure of claim 1, wherein the PFET region may be between 20 nanometers and 40 nanometers from the NFET region.

5. The hybrid semiconductor structure of claim 1, further comprising:
a shallow trench isolation (STI) region below and between the PFET region and the NFET region.

6. The hybrid semiconductor structure of claim 1, wherein the isolation bar comprises at least one of SIN, SiOCN, SiBCN, SiOC, and SiC.

7. The hybrid semiconductor structure of claim 1, where the PFET region further comprises a third channel.

8. A system, wherein the system comprises:
a hybrid semiconductor structure, the hybrid semiconductor structure comprising:
a PFET region, wherein the PFET region comprises a first channel in a fin shape;
an NFET region, wherein the NFET region comprises a second channel, the second channel comprising a nanosheet;
an isolation bar separating the PFET region from the NFET region and extending above and below both the first channel and the second channel, the isolation bar directly connected to a sidewall of the nanosheet; and
a gate surrounding a plurality of sidewalls of the first channel and the second channel.

9. The system of claim 8, wherein the isolation bar is connected to the second channel.

10. The system of claim 8, wherein the PFET region may be between 20 nanometers and 40 nanometers from the NFET region.

11. The system of claim 8, wherein the hybrid semiconductor structure further comprises a substrate, wherein the substrate is below the PFET region and the NFET region.

12. The system of claim 11, wherein the isolation bar is connected to the substrate.

13. The system of claim 12, wherein the isolation bar extends above the first channel and the second channel.

14. The system of claim 8, wherein the isolation bar comprises at least one of SiN, SiOCN, SiBCN, SiOC, and SiC.

15. A hybrid semiconductor structure comprising:
a first region;
a second region;
a shallow trench isolation (STI) region below and between the first region and the second region;

a first transistor within the first region and comprising a vertically orientated fin channel;

a second transistor within the second region and comprising a horizontally orientated nanosheet channel; and an isolation bar separating the vertically orientated fin channel and the horizontally orientated nanosheet channel and extending above at least one of the vertically orientated fin channel and horizontally orientated nanosheet channel and extending below the STI region.

16. The hybrid semiconductor structure of claim 15, wherein a sidewall of the horizontally orientated nanosheet channel is directly connected to the isolation bar.

17. The hybrid semiconductor structure of claim 16, wherein the isolation bar is further directly connected to a substrate, wherein the substrate is below the first transistor and below the second transistor.

18. The hybrid semiconductor structure of claim 15, wherein a top surface of the isolation bar is above respective top surfaces of the vertically orientated fin channel and the horizontally orientated nanosheet channel.

19. The hybrid semiconductor structure of claim 15, wherein a top surface of the vertically orientated fin channel and a top surface of the horizontally orientated nanosheet channel are substantially coplanar.

20. The hybrid semiconductor structure of claim 17, further comprising:

a first bottom dielectric isolation (BDI) region upon the substrate aligned with the vertically orientated fin channel; and a second bottom BDI region upon the substrate aligned with the horizontally orientated nanosheet channel.

* * * * *